(12) United States Patent
Zhang et al.

(10) Patent No.: US 12,740,436 B2
(45) Date of Patent: Sep. 15, 2026

(54) CURRENT SENSOR WITH INVERTED SHIELDING ELEMENT

(71) Applicant: Littelfuse Semiconductor (Wuxi) Co., Ltd., Wuxi (CN)

(72) Inventors: Lucas Zhang, Wuxi (CN); Chao Gao, Wuxi (CN); Lei He, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 367 days.

(21) Appl. No.: 18/495,831

(22) Filed: Oct. 27, 2023

(65) Prior Publication Data

US 2024/0145348 A1 May 2, 2024

(30) Foreign Application Priority Data

Oct. 28, 2022 (CN) ........................ 202211338063.9

(51) Int. Cl.
*H10W 70/40* (2026.01)
*H10W 72/00* (2026.01)
(Continued)

(52) U.S. Cl.
CPC ....... *H10W 70/417* (2026.01); *H10W 70/421* (2026.01); *H10W 76/161* (2026.01);
(Continued)

(58) Field of Classification Search
CPC ............. H10W 70/424; H10W 70/466; H10W 70/481; H10W 70/442; H10W 70/429;
(Continued)

(56) References Cited

U.S. PATENT DOCUMENTS

2006/0108671 A1 5/2006 Kasem
2012/0248592 A1 10/2012 Hata
(Continued)

FOREIGN PATENT DOCUMENTS

KR 1020110100933 A 9/2011
KR 1020150097922 A 8/2015
(Continued)

OTHER PUBLICATIONS

European Search Report for EP Application No. 23204590.6, dated Apr. 4, 2024, 8 pages.

*Primary Examiner* — Marc-Anthony Armand
(74) *Attorney, Agent, or Firm* — KDW Firm PLLC

(57) ABSTRACT

A semiconductor device including a housing, a semiconductor chip disposed within the housing and having first and second metal electrodes, a first lead frame having a first end extending out of the housing and a second end terminating in a die pad, a top surface of the die pad including a cavity having a first quantity of solder disposed therein for electrically connecting the die pad to the first metal electrode, a second lead frame having a first end extending out of the housing and having a second end disposed adjacent the semiconductor chip, and a clip having a first end connected to the second of the lead frame and a second end extending over the semiconductor chip, a bottom surface of the second end of the clip including a recess having a second quantity of solder disposed therein for electrically connecting the clip to the second metal electrode.

14 Claims, 2 Drawing Sheets

(51) Int. Cl.
*H10W 76/12* (2026.01)
*H10W 90/00* (2026.01)

(52) U.S. Cl.
CPC ........ *H10W 72/886* (2026.01); *H10W 90/736* (2026.01); *H10W 90/766* (2026.01)

(58) Field of Classification Search
CPC ... H10W 72/60; H10W 74/111; H10W 42/60; H10W 90/732; H01L 23/49513; H01L 23/041; H01L 23/49541; H01L 23/49562; H01L 23/49548; H01L 23/3107; H01L 23/49537; H01L 23/60; H01L 24/32; H01L 24/40; H01L 24/73
See application file for complete search history.

(56) References Cited

U.S. PATENT DOCUMENTS

2016/0322342 A1 11/2016 Kimura
2016/0365305 A1* 12/2016 Ding .................... H10W 74/111
2018/0240770 A1 8/2018 Choi
2020/0176342 A1* 6/2020 Choi ................... H10W 70/424
2023/0137852 A1* 5/2023 Moreno .............. H10W 70/424
257/666

FOREIGN PATENT DOCUMENTS

KR 1020190099709 A 8/2019
KR 1020220038002 A 3/2022

* cited by examiner

CURRENT SENSOR WITH INVERTED SHIELDING ELEMENT

FIELD OF THE DISCLOSURE

This application claims the benefit of priority to, Chinese Patent Application No. 2022113380639, filed Oct. 28, 2022, entitled "SEMICONDUCTOR DEVICE PACKAGE WITH REDUCED THERMAL AND MECHANICAL STRESS," which application is incorporated herein by reference in its entirety.

FIELD OF THE DISCLOSURE

The present disclosure relates generally to the field of semiconductor devices and relates more particularly to a package structure for transient-voltage-suppression (TVS) devices.

FIELD OF THE DISCLOSURE

Packaging an integrated circuit is typically the final stage of semiconductor device fabrication. During packaging, a semiconductor chip, which represents the core of a semiconductor device, is connected to a die pad and a clip that are configured to provide an electrical connection between the semiconductor chip and a circuit to which the semiconductor device is connected. The semiconductor chip, the clip, and the die pad are then encased in a dielectric housing (plastic or epoxy compound, for example) that protects the encased components from physical damage and corrosion.

Typically, the die pad and the clip of a semiconductor device are electrically connected to opposing sides of a semiconductor chip in flat abutment therewith using solder. As power requirements for semiconductor devices have increased and package sizes have decreased it has been found that the quantity/thickness of solder that can be provided between the flat, abutting surfaces of the semiconductor chip, die pad, and clip are sometimes insufficient to protect the semiconductor chip from excessive thermal and mechanical stresses imparted by the die pad and the clip. Such stresses can result from excessive heat being transferred to the semiconductor chip from the die pad and the clip and from a mismatch in the coefficients of thermal expansion of the semiconductor chip and the die pad and/or the clip. The semiconductor chip is therefore prone to cracking during reliability tests of the semiconductor device and even during regular use of the semiconductor device.

It is with respect to these and other considerations that the present improvements may be useful.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

An exemplary embodiment of a semiconductor device in accordance with the present disclosure may include a dielectric housing, a semiconductor chip disposed within the housing, the semiconductor chip having first and second metal electrodes disposed on opposing surfaces thereof, a first lead frame having a first end extending out of the housing and having a second end terminating in a die pad upon which the semiconductor chip is mounted, wherein a top surface of the die pad includes a cavity having a first quantity of solder disposed therein, the first quantity of solder electrically connecting the die pad to the first metal electrode of the semiconductor chip, a second lead frame having a first end extending out of the housing and having a second end disposed adjacent the semiconductor chip, and a clip having a first end connected to the second of the lead frame and a second end extending over the semiconductor chip, wherein a bottom surface of the second of the clip includes a recess having a second quantity of solder formed therein, the second quantity of solder electrically connecting the clip to the second metal electrode of the semiconductor chip.

An exemplary embodiment of a semiconductor device package in accordance with the present disclosure may include a dielectric housing, a first lead frame having a first end extending out of the housing and having a second end terminating in a die pad adapted to support a semiconductor chip, wherein a top surface of the die pad includes a cavity having a first quantity of solder disposed therein, a second lead frame having a first end extending out of the housing and having a second end disposed within the housing, and a clip having a first end connected to the second of the lead frame and a second end adapted to be electrically connected to the semiconductor chip, wherein a bottom surface of the second of the clip includes a recess having a second quantity of solder formed therein.

Figure 1A:
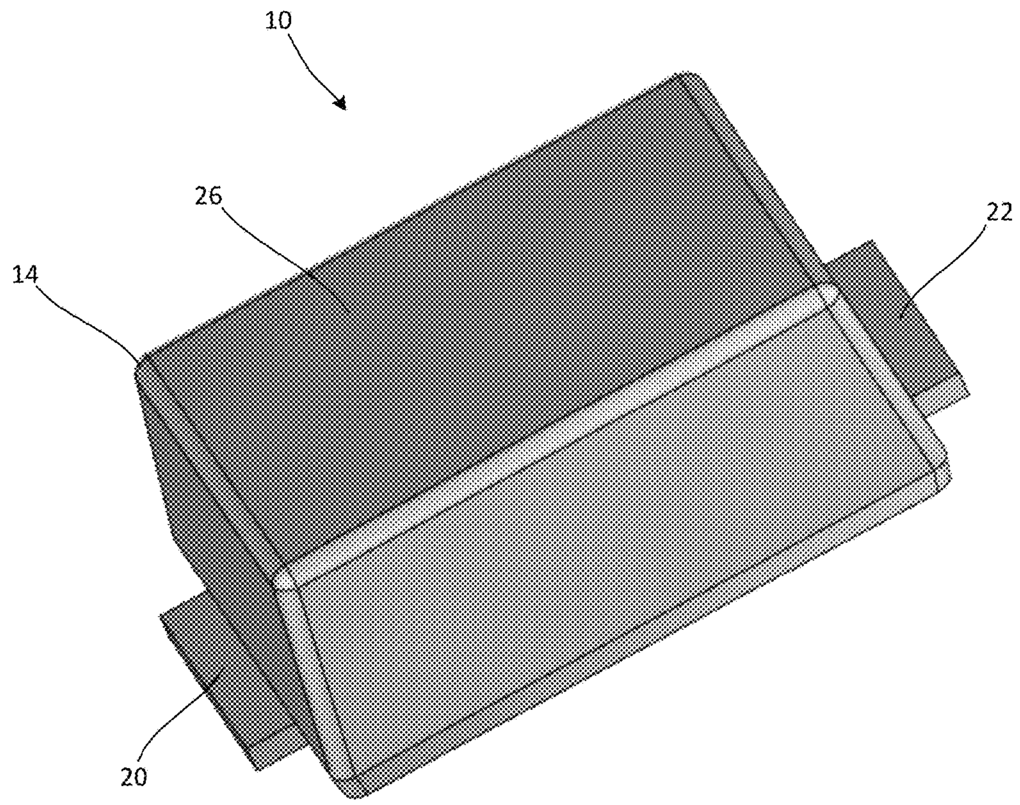
FIG. 1A is a perspective view illustrating a semiconductor device in accordance with an exemplary embodiment of the present disclosure.

The drawings are not necessarily to scale. The drawings are merely representations, not intended to portray specific parameters of the disclosure. The drawings are intended to depict example embodiments of the disclosure, and thus are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Embodiments of a semiconductor device package in accordance with the present disclosure will now be described more fully with reference to the accompanying drawings, in which preferred embodiments of the present disclosure are presented. The semiconductor device package of the present disclosure may, however, be embodied in many different forms and should not be construed as being limited to the embodiments set forth herein. Rather, these embodiments are provided so that this disclosure will be thorough and complete, and will fully convey the scope of the semiconductor device package to those skilled in the art. In the drawings, like numbers refer to like elements throughout unless otherwise noted.

Figure 1B:
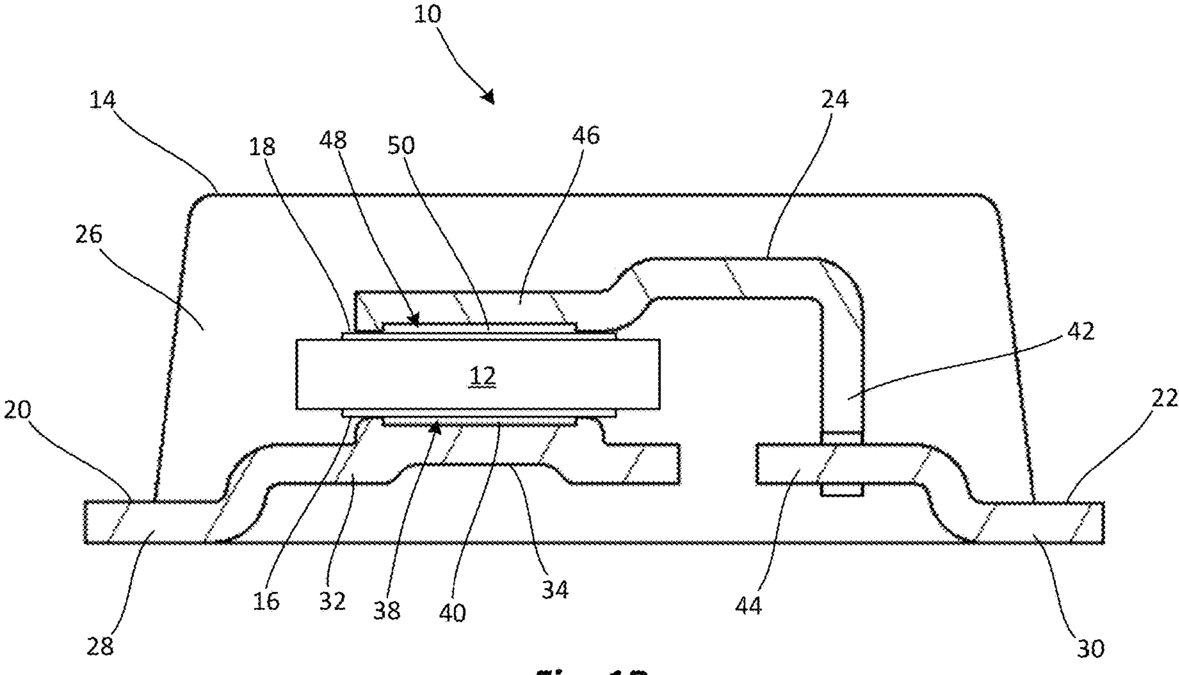
FIG. 1B is a cross-sectional view illustrating the semiconductor device of FIG. 1A.

Referring to FIGS. 1A and 1B, an isometric view and a cross-sectional view illustrating a semiconductor device 10 (hereinafter "the device 10") in accordance with an exemplary embodiment of the present disclosure are provided, respectively. For the sake of convenience and clarity, terms such as "top," "bottom," "up," "down," "upper," "lower," "above," and "below" may be used herein to describe the relative positions and orientations of various components of the device 10, all with respect to the geometry and orientation of the device 10 as it appears in FIGS. 1A and 1B. Said terminology will include the words specifically mentioned, derivatives thereof, and words of similar import.

The device 10 may generally include a semiconductor chip 12 (hereinafter "the chip 12") disposed within a package 14. In various embodiments the chip 12 may be transient voltage suppression (TVS) device/chip and may have first and second metal electrodes 16, 18 disposed on opposing surfaces thereof. The present disclosure is not limited in this regard. The package 14 of the device 10 may include a first lead frame 20, a second lead frame 22, a clip 24, and a housing 26. The housing 26 may be formed of a dielectric material (e.g., plastic, epoxy compound, etc.) and may encapsulate the chip 12, the clip 24 and portions of the first and second lead frames 20, 22 for protecting the encased components from physical damage and corrosion.

Figure 2:
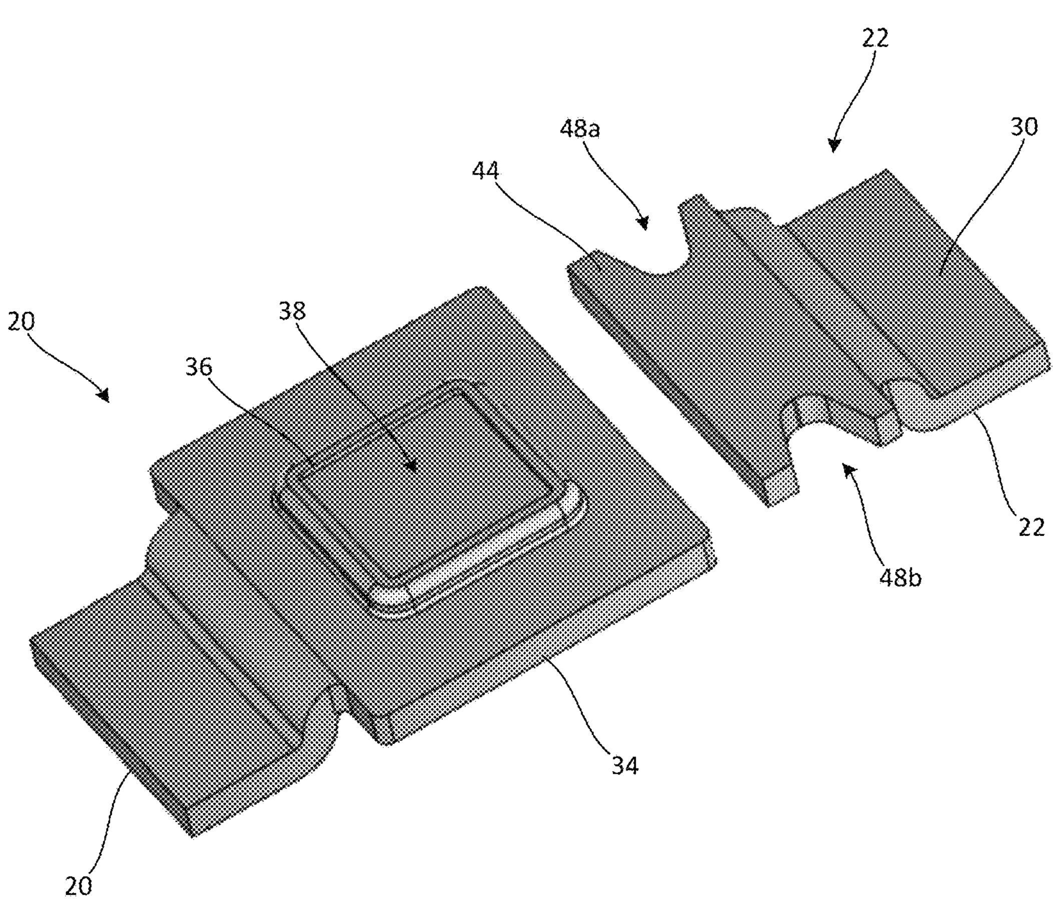
FIG. 2 is a perspective view illustrating lead frames of the semiconductor device of FIG. 1A.

The first and second lead frames 20, 22 may be electrically connected to the chip 12 (as further described below) and may have respective first ends 28, 30 that extend out of the housing 26 for connecting the device 10 to an electrical circuit. The first and second lead frames 20, 22 may be formed of an electrically conductive material, including, but not limited to, copper, copper alloy, silver, etc. A second end 32 of the first lead frame 20 may terminate in a die pad 34 upon which the chip 12 may be mounted. Referring to FIG. 2, the die pad 34 may be a generally planar, rectangular member having an embossed lip 36 extending from a top surface thereof, wherein the lip 36 bounds a crater or cavity 38. In various embodiments, the cavity 38 may have a length in a range of 0.70 millimeters to 1.27 millimeters, a width in a range of 0.70 millimeters to 1.27 millimeters, and a depth in a range of 0.005 millimeters to 0.05 millimeters. The present disclosure is not limited in this regard. The dimensions for a particular application will depend on chip sizes. The lip 36 is depicted as being square in shape, but this is not critical. The lip 36 may alternatively be annular, rectangular, etc. In various embodiments, the lip 36 may be entirely omitted and the cavity 38 may be defined by a depression formed in the top surface of the die pad 34. The present disclosure is not limited in this regard.

When the device 10 is assembled as shown in FIG. 1B, a quantity of solder 40 may be disposed within the cavity 38 and may electrically connect the first metal electrode 16 (and thus the chip 12) to the die pad 34. The lip 36 may act as a gasket that retains the solder 40 and provides good electrical contact with the first metal electrode 16. The cavity 38 allows a significantly greater amount of solder to be retained between the first metal electrode 16 and the die pad 34 relative to a conventional package configuration in which the die pad has a flat top surface (i.e., with no cavity). This increased quantity of solder may protect the semiconductor chip 12 from thermal and mechanical stresses that can result from excessive heat being transferred to the semiconductor chip 12 from the die pad 34 and from a mismatch in the coefficients of thermal expansion of the chip 12 and the die pad 34. The chip 12 is therefore less prone to cracking during manufacture of the device 10 (e.g., when the die pad 34 is soldered to the chip 12) and during regular use of the device 10.

Figure 3:
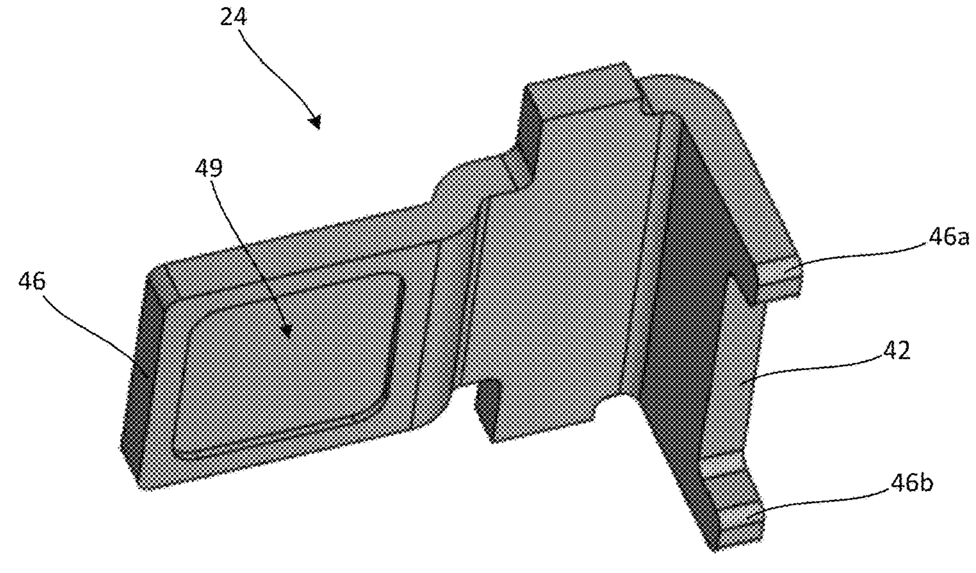
FIG. 3 is a perspective view illustrating a clip of the semiconductor device of FIG. 1A.

The clip 24 may be a generally L-shaped member formed of an electrically conductive material, including, but not limited to, copper, copper alloy, silver, etc. The clip 24 may have a first end 42 connected to a second end 44 of the second lead frame 22. In various embodiments, the first end 42 of the clip 24 may have first and second prongs 46_a_, 46_b_ extending therefrom that fit into complementary first and second notches 48_a_, 48_b_ formed in opposing edges of the second end 44 of the second lead frame 22 (see FIGS. 2 and 3), with a terminal edge of the first end 42 of the clip 24 disposed on a top surface of the second end 44 of the second lead frame 22 (as shown in FIG. 1B). The present disclosure is not limited in this regard. A second end 46 of the clip 24 may extend over the chip 12 and may have a generally planar bottom surface with a recess 49 formed therein. In various embodiments, the recess 49 may have a length in a range of 0.70 millimeters to 1.27 millimeters, a width in a range of 0.70 millimeters to 1.27 millimeters, and a depth in a range of 0.005 millimeters to 0.05 millimeters. The present disclosure is not limited in this regard. Referring to FIG. 3, the recess 49 is depicted as being square in shape, but this is not critical. The recess 48 may alternatively be annular, rectangular, etc.

When the device 10 is assembled as shown in FIG. 1B, a quantity of solder 50 may be disposed within the recess 49 and may electrically connect the clip 24 to the second metal electrode 18. The recess 49 allows a significantly greater amount of solder to be retained between the second metal electrode 18 and the clip 24 relative to a conventional package configuration in which the clip 24 has a flat bottom surface (i.e., with no cavity). This increased quantity of solder may protect the semiconductor chip 12 from thermal and mechanical stresses that can result from excessive heat being transferred to the semiconductor chip 12 from the clip 24 and from a mismatch in the coefficients of thermal expansion of the chip 12 and the clip 24. The chip 12 is therefore less prone to cracking during manufacture of the device 10 (e.g., when the clip 24 is soldered to the chip 12) and during regular use of the device 10.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A semiconductor device comprising:

a dielectric housing;

a semiconductor chip disposed within the dielectric housing, the semiconductor chip having first and second metal electrodes disposed on opposing surfaces thereof;

a first lead frame having a first end extending out of the dielectric housing and having a second end terminating in a die pad upon which the semiconductor chip is mounted, wherein a top surface of the die pad is planar and includes a cavity defined by a lip extending outwardly from the top surface of the die pad, the cavity having a first quantity of solder disposed therein, and wherein the first quantity of solder electrically connects the die pad to the first metal electrode of the semiconductor chip;

a second lead frame having a first end extending out of the dielectric housing and having a second end disposed adjacent the semiconductor chip; and a clip having a first end connected to the second of the lead frame and a second end extending over the semiconductor chip, wherein a bottom surface of the second end of the clip includes a recess having a second quantity of solder disposed therein, and wherein the second quantity of solder electrically connects the clip to the second metal electrode of the semiconductor chip.

2. The semiconductor device of claim 1, wherein the lip is rectangular.

3. The semiconductor device of claim 1, wherein the cavity has a depth in a range of 0.005 millimeters to 0.05 millimeters.

4. The semiconductor device of claim 1, wherein the recess has a depth in a range of 0.005 millimeters to 0.05 millimeters.

5. The semiconductor device of claim 1, wherein the semiconductor chip is a transient voltage suppression device.

6. The semiconductor device of claim 1, wherein the clip is L-shaped.

7. The semiconductor device of claim 1, wherein the first end of the clip includes first and second prongs that fit into complementary first and second notches formed in opposing edges of the second end of the second lead frame.

8. A semiconductor device package comprising:

a dielectric housing;

a first lead frame having a first end extending out of the dielectric housing and having a second end terminating in a die pad adapted to support a semiconductor chip, wherein a top surface of the die pad is planar and includes a cavity defined by a lip extending outwardly from the top surface of the die pad, the cavity having a first quantity of solder disposed therein;

a second lead frame having a first end extending out of the dielectric housing and having a second end disposed within the dielectric housing; and a clip having a first end connected to the second of the lead frame and a second end adapted to be electrically connected to the semiconductor chip, wherein a bottom surface of the second end of the clip includes a recess having a second quantity of solder disposed therein.

9. The semiconductor device package of claim 8, wherein the lip is rectangular.

10. The semiconductor device package of claim 8, wherein the cavity has a depth in a range of 0.005 millimeters to 0.05 millimeters.

11. The semiconductor device package of claim 8, wherein the recess has a depth in a range of 0.005 millimeters to 0.05 millimeters.

12. The semiconductor device package of claim 8, wherein the semiconductor chip is a transient voltage suppression device.

13. The semiconductor device package of claim 8, wherein the clip is L-shaped.

14. The semiconductor device package of claim 8, wherein the first end of the clip includes first and second prongs that fit into complementary first and second notches formed in opposing edges of the second end of the second lead frame.

* * * * *